US010038037B2

(12) United States Patent
Choung et al.

(10) Patent No.: US 10,038,037 B2
(45) Date of Patent: Jul. 31, 2018

(54) ORGANIC LIGHT-EMITTING DISPLAY DEVICE AND METHOD OF MANUFACTURING THE SAME

(71) Applicant: Samsung Display Co., Ltd., Yongin-si, Gyeonggi-do (KR)

(72) Inventors: Jiyoung Choung, Yongin-si (KR); Arong Kim, Yongin-si (KR); Jungsun Park, Yongin-si (KR); Hyungsung Bang, Yongin-si (KR); Jinbaek Choi, Yongin-si (KR); Younggil Kwon, Yongin-si (KR); Duckjung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 75 days.

(21) Appl. No.: 15/136,628

(22) Filed: Apr. 22, 2016

(65) Prior Publication Data
US 2017/0069695 A1    Mar. 9, 2017

(30) Foreign Application Priority Data

Sep. 3, 2015  (KR) ........................ 10-2015-0124943

(51) Int. Cl.
*H01L 27/32* (2006.01)
*H01L 51/52* (2006.01)

(52) U.S. Cl.
CPC ...... *H01L 27/3246* (2013.01); *H01L 27/3211* (2013.01); *H01L 51/5228* (2013.01)

(58) Field of Classification Search
CPC ................................................ H01L 27/3248
See application file for complete search history.

(56) References Cited

U.S. PATENT DOCUMENTS

2006/0091397 A1    5/2006 Akimoto et al.
2006/0192834 A1    8/2006 Tsujino et al.
(Continued)

FOREIGN PATENT DOCUMENTS

JP    2000-021578 A    1/2000
JP    2006-236727 A    9/2006
(Continued)

*Primary Examiner* — Fernando L Toledo
*Assistant Examiner* — Valerie N Newton
(74) *Attorney, Agent, or Firm* — Lewis Roca Rothgerber Christie LLP

(57) ABSTRACT

An organic light-emitting display device includes a substrate including first and second pixel regions, pixel electrodes respectively corresponding thereto, a pixel-defining layer on the substrate, defining a first opening corresponding to the first pixel region, and defining a second opening corresponding to the second pixel region, a first intermediate layer in the first opening and corresponding to the first pixel region, a first opposite electrode on the first intermediate layer, a second intermediate layer in the second opening and corresponding to the second pixel region, a second opposite electrode on the second intermediate layer and spaced from the first opposite electrode, a connection electrode layer on the pixel-defining layer to cover the first and second pixel regions, and configured to electrically connect the first opposite electrode to the second opposite electrode, and a conductive adhesive layer between the pixel-defining layer and the connection electrode layer, and contacting the pixel-defining layer.

20 Claims, 14 Drawing Sheets

(56) References Cited

U.S. PATENT DOCUMENTS

2007/0290196 A1* 12/2007 Fischer ............... H01L 27/3253
  257/40
2014/0175390 A1   6/2014 Kim et al.
2016/0035804 A1*  2/2016 Cheng ................ H01L 51/0024
  257/40

FOREIGN PATENT DOCUMENTS

| KR | 10-2006-0052371 A | 5/2006 |
| KR | 10-2012-0076940 A | 7/2012 |
| KR | 10-2014-0082089 A | 7/2014 |

* cited by examiner

ORGANIC LIGHT-EMITTING DISPLAY DEVICE AND METHOD OF MANUFACTURING THE SAME

CROSS-REFERENCE TO RELATED APPLICATION

This application claims priority to, and the benefit of, Korean Patent Application No. 10-2015-0124943, filed on Sep. 3, 2015, in the Korean Intellectual Property Office, the disclosure of which is incorporated herein in its entirety by reference.

BACKGROUND

1. Field

One or more exemplary embodiments relate to an organic light-emitting display device, and a method of manufacturing the same.

2. Description of the Related Art

An organic light-emitting display device has not only a lightweight slim profile, but also has wide viewing angles, fast response speeds, and low power consumption, so that the organic light-emitting display device is in the limelight as a next-generation display device.

In the case of an organic light-emitting display device that produces full colors, light of different colors is emitted by respective pixel regions, and an organic emission layer may be patterned for respective pixel regions.

SUMMARY

One or more exemplary embodiments include an organic light-emitting display device and a method of manufacturing the same.

Additional aspects will be set forth in part in the description that follows and, in part, will be apparent from the description, or may be learned by practice of the presented embodiments.

According to one or more exemplary embodiments, an organic light-emitting display device includes a substrate including a first pixel region and a second pixel region, pixel electrodes respectively corresponding to the first and second pixel regions, a pixel-defining layer on the substrate and defining a first opening corresponding to the first pixel region, and defining a second opening corresponding to the second pixel region, a first intermediate layer in the first opening and corresponding to the first pixel region, a first opposite electrode on the first intermediate layer, a second intermediate layer in the second opening and corresponding to the second pixel region, a second opposite electrode on the second intermediate layer and spaced from the first opposite electrode, a connection electrode layer on the pixel-defining layer to cover the first pixel region and to cover the second pixel region, and configured to electrically connect the first opposite electrode to the second opposite electrode, and a conductive adhesive layer between the pixel-defining layer and the connection electrode layer, and contacting the pixel-defining layer.

The pixel-defining layer may include a bank between the first opening and the second opening, a first point of the bank may include a first organic material, and an upper surface of the bank may include a second organic material that is different from the first organic material.

The conductive adhesive layer may directly contact the upper surface of the bank.

The second organic material may include a fluorine-based polymer.

The first point of the bank may be below the upper surface of the bank.

A thickness of the conductive adhesive layer may be smaller than a thickness of the connection electrode layer.

The connection electrode layer may include a first metallic element, and the conductive adhesive layer may include a second metallic element that is different from the first metallic element.

The first metallic element may include at least one of silver (Ag) or magnesium (Mg).

The second metallic element may include aluminum (Al), indium (In), or tungsten (W).

The conductive adhesive layer may include a metallic layer having light transmittance.

The conductive adhesive layer may include an oxide metallic layer having light transmittance.

According to one or more exemplary embodiments, a method of manufacturing an organic light-emitting display device includes preparing a substrate including a first pixel region and a second pixel region, forming pixel electrodes respectively corresponding to the first pixel region and the second pixel region, forming a pixel-defining layer on the substrate, the pixel-defining layer defining a first opening and a second opening that respectively expose the pixel electrodes, forming a first intermediate layer corresponding to the first pixel region, forming a first opposite electrode on the first intermediate layer, forming a second intermediate layer corresponding to the second pixel region, forming a second opposite electrode on the second intermediate layer, forming a conductive adhesive layer on the pixel-defining layer, and forming a connection electrode layer to electrically connect the first opposite electrode and the second opposite electrode.

The pixel-defining layer may include a bank between the first opening and the second opening, and, in the forming of the conductive adhesive layer, the conductive adhesive layer may directly contact an upper surface of the bank, the upper surface of the bank including a second organic material that is different from a first organic material at a first point of the bank.

The second organic material may include a fluorine-based polymer.

The forming of the first intermediate layer and the forming of the first opposite electrode may include using a first masking pattern, the first masking pattern including a first mediation layer for directly contacting an upper surface of the pixel-defining layer adjacent the first opening, and defining a first opening region corresponding to the first opening, and a first photosensitive pattern layer on the first mediation layer, and including a second opening region corresponding to the first opening region.

A size of the first opening region may be greater than a size of the second opening region.

The method may further include removing the first masking pattern by using a solvent to remove the first mediation layer.

The connection electrode layer may include a first metallic element, and the conductive adhesive layer may include a second metallic element that is different from the first metallic element.

The first metallic element may include at least one of silver (Ag) and magnesium (Mg).

The second metallic element may include aluminum (Al), indium (In), or tungsten (W).

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
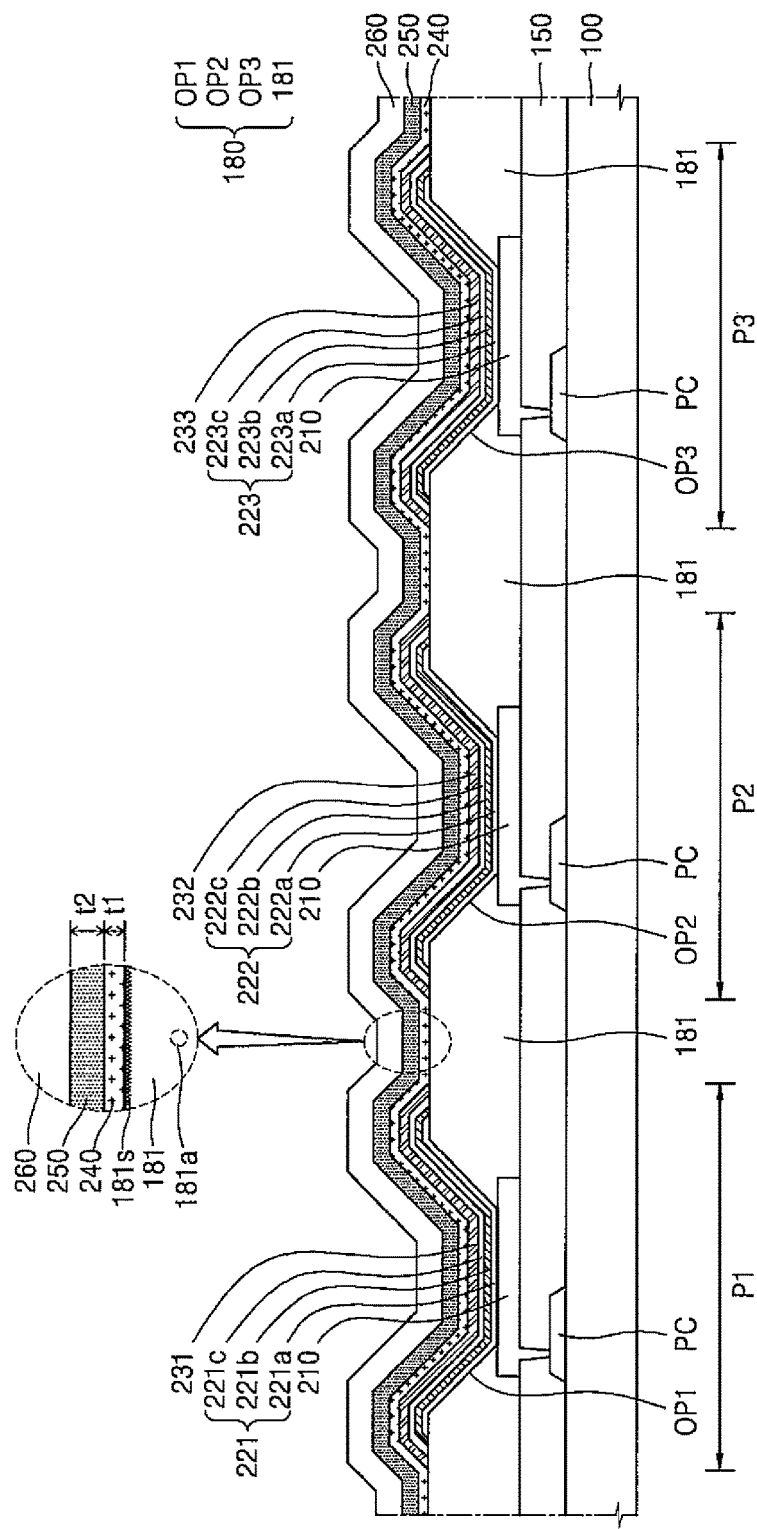
FIG. 1 is a schematic cross-sectional view illustrating an organic light-emitting display device according to an exemplary embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or. layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic cross-sectional view illustrating an organic light-emitting display device according to an exemplary embodiment.

Referring to FIG. 1, the organic light-emitting display device includes pixel regions P1, P2, and P3. Each of the pixel regions P1, P2, and P3 corresponds to a pixel, and each pixel emits light that is different from the light emitted by the other pixels. One of the first to third pixel regions P1, P2, and P3 may produce a red color, another of the first to third pixel regions P1, P2, and P3 may produce a green color, and the last of the first to third pixel regions P1, P2, and P3 may produce a blue color. For example, the pixel regions P1, P2, and P3 may be pixels that produce red color, green color, and blue color, respectively. In the following description, although the first pixel region P1 produces the red color, the second pixel region P2 produces the green color, and the third pixel region P3 produces the blue color, as an example, for convenience of description, the present invention is not limited thereto. A combination of different colors other than red, green, and blue colors may be produced. According to another exemplary embodiment, various modifications may be produced such that the combination produces full colors, such as a combination of four colors including, for example, red, green, blue, and white colors.

Stacked structures spaced apart from each other are respectively located on the pixel regions P1, P2, and P3. Each of the stacked structures may include a pixel electrode 210, sections having intermediate layers 221, 222, 223, and opposite electrodes 231, 232, 233. The opposite electrodes 231, 232, 233 are spaced apart from each other, and are electrically connected by a connection electrode layer 250, while a conductive adhesive layer 240 is disposed below the connection electrode layer 250.

The pixel electrode 210 is electrically connected with a pixel circuit PC formed on a substrate 100. The pixel circuit PC may include a thin film transistor and a capacitor, and may be electrically connected with the pixel electrode 210 provided to each of the pixel regions P1, P2, and P3. An insulating layer 150 having an approximately flat upper surface covers the pixel circuit PC.

The substrate 100 may include various materials, such as a plastic material including polyethylene terephthalate (PET), polyethylene naphthalate (PEN), and polyimide. According to an exemplary embodiment, in the case where the substrate 100 includes a plastic material or a metallic material, flexibility may improve when compared to the case where the substrate 100 includes a glass material. A buffer layer including $SiO_2$ and/or SiNx, for preventing penetration of impurities, may be provided on the substrate 100.

The pixel electrodes 210 are spaced apart from each other in an island type.

In the present embodiment, the pixel electrode 210 is an anode electrode as a reflective electrode. According to an exemplary embodiment, the pixel electrode 210 may include a single reflective metallic layer including Ag, Al, Au, Pt, Cr, or an alloy thereof. According to another exemplary embodiment, the pixel electrode 210 may be a double or a triple layer further including an indium tin oxide (ITO) or indium zinc oxide (IZO) layer above and/or below the above-described single reflective metallic layer.

A pixel-defining layer 180 includes openings OP1, OP2, OP3, which respectively correspond to the pixel regions P1, P2, P3, and also includes a bank 181 between adjacent ones of the openings OP1, OP2, OP3. The pixel-defining layer 180 may be an insulating layer, and may include a carbon-based organic material. The pixel electrodes 210 may be respectively exposed via the openings OP1, OP2, OP3. The bank 181 may cover the edge(s) of the pixel electrode(s) 210. The bank 181 may prevent an arc (e.g., an electrical short) from occurring at the end of the pixel electrode 210 by increasing a distance between the end of the pixel electrode 210 and the end of the opposite electrodes 231, 232, 233, and/or by increasing a distance between the pixel electrode 210 and the connection electrode layer 250.

The intermediate layers 221, 222, 223 and the opposite electrodes 231, 232, 233 are respectively located in the pixel regions P1, P2, P3. The intermediate layer 221 corresponding to the first pixel region P1 is referred to as a first intermediate layer 221, the intermediate layer 222 corresponding to the second pixel region P2 is referred to as a second intermediate layer 222, and the intermediate layer 223 corresponding to the third pixel region P3 is referred to as a third intermediate layer 223. Also, the opposite electrode 231 corresponding to the first pixel region P1 is referred to as a first opposite electrode 231, the opposite electrode 232 corresponding to the second pixel region P2 is referred to as a second opposite electrode 232, and the opposite electrode 233 corresponding to the third pixel region P3 is referred to as a third opposite electrode 233.

The first to third intermediate layers 221, 222, 223 are spaced apart from each other, and the first to third opposite electrodes 231, 232, 233 are spaced apart from each other.

The first intermediate layer 221 may include a first emission layer 221b, and may also include a first functional layer 221a and a second functional layer 221c, which may be respectively disposed below and above the first emission layer 221b. The first emission layer 221b may include a fluorescent material or a phosphor material for emitting red light. The first functional layer 221a may include a hole injection layer (HIL) and/or a hole transport layer (HTL). The first functional layer 221a may be a single layer of the HTL, or may be HTLs and HILs, depending on a material included in the first emission layer 221b. The second functional layer 221c may include an electron transport layer (ETL) and/or an electron injection layer (EIL). According to an exemplary embodiment, when the first opposite electrode 231, as described below, is a (semi) transmissive metallic layer with high Ag content, the second functional layer 221c may include an EIL including Yb, etc.

The first opposite electrode 231 has light transmittance as a cathode electrode. According to an exemplary embodiment, the first opposite electrode 231 may be a (semi) transmissive metallic layer including Ag and Mg. For example, the first opposite electrode 231 may include an Ag—Mg alloy in which Ag content is greater than Mg content. According to another exemplary embodiment, the first opposite electrode 231 may be a transparent conductive layer including a transparent conductive oxide (TCO), such as ITO and IZO.

The end of the first opposite electrode 231 may cover the end of the first intermediate layer 221, which is provided below the first opposite electrode 231. The first emission layer 221b may cover the end of the first functional layer 221a, the second functional layer 221c may cover the end of the first emission layer 221b, and the first opposite electrode 231 may cover the end of the second functional layer 221c.

The end of the first opposite electrode 231 may have an inclined surface. Because the inclined surface has a forward taper shape that is smoothly connected with the upper surface of the bank 181, and does not have a reverse taper shape, the inclined surface may reduce the likelihood that the conductive adhesive layer 240 is cut or damaged at a connection portion of the end of the first opposite electrode 231 and the bank 181.

The second intermediate layer 222 may include a second emission layer 222b, and may also include a first functional layer 222a and a second functional layer 222c that may be respectively disposed below and above the second emission layer 222b. The second emission layer 222b may include a fluorescent material or a phosphor material for emitting green light. The first functional layer 222a may include an HIL and/or an HTL. The first functional layer 222a may be a single HTL, or may be HTLs and HILs, depending on a material included in the second emission layer 222b. The second functional layer 222c may include the ETL and/or the EIL. According to an exemplary embodiment, when the second opposite electrode 232, as described below, is a (semi) transmissive metallic layer with high Ag content, the second functional layer 222c may include an EIL including Yb, etc.

The second opposite electrode 232 has light transmittance as a cathode electrode. According to an exemplary embodiment, the second opposite electrode 232 may be a (semi) transmissive metallic layer including Ag and Mg. For example, the second opposite electrode 232 may include an Ag—Mg alloy in which Ag content is greater than Mg content. According to another exemplary embodiment, the second opposite electrode 232 may be a transparent conductive layer including TCO, such as ITO and IZO.

The end of the second opposite electrode 232 may cover the end of the second intermediate layer 222, which is provided below the second opposite electrode 232. The second emission layer 222b may cover the end of the first functional layer 222a, the second functional layer 222c may cover the end of the second emission layer 222b, and the second opposite electrode 232 may cover the end of the second functional layer 222c.

The end of the second opposite electrode 232 may have an inclined surface. Because the inclined surface has a forward taper shape that is smoothly connected with the upper surface of the bank 181, as opposed to a reverse taper shape, the inclined surface may reduce the change that the conductive adhesive layer 240 is cut or damaged at a connection portion of the end of the second opposite electrode 232 and the bank 181.

The third intermediate layer 223 may include a third emission layer 223b, and may also include a first functional layer 223a and a second functional layer 221c that are respectively disposed below and above the third emission layer 223b. The third emission layer 223b may include a fluorescent material or a phosphor material for emitting blue light. The first functional layer 223a may include an HIL and/or an HTL. The first functional layer 223a may be a single HTL, or may be HTLs and HILs, depending on a material included in the third emission layer 223b. The second functional layer 223c may include the ETL and/or the EIL. According to an exemplary embodiment, when the third opposite electrode 233, as described below, is a (semi) transmissive metallic layer with high Ag content, the second functional layer 223c may include an EIL including Yb, etc.

The third opposite electrode 233 has light transmittance as a cathode electrode. According to an exemplary embodiment, the third opposite electrode 233 may be a (semi) transmissive metallic layer including Ag and Mg. For example, the third opposite electrode 233 may include an Ag—Mg alloy in which Ag content is greater than Mg content. According to another exemplary embodiment, the third opposite electrode 233 may be a transparent conductive layer including TCO, such as ITO and IZO.

The end of the third opposite electrode 233 may cover the end of the third intermediate layer 223, which is provided below the third opposite electrode 233. The third emission layer 223b may cover the end of the first functional layer 223a, the second functional layer 223c may cover the end of the third emission layer 223b, and the third opposite electrode 233 may cover the end of the second functional layer 223c.

The end of the third opposite electrode 233 may have an inclined surface. Because the inclined surface has a forward taper shape that is smoothly connected with the upper surface of the bank 181, and does not have a reverse taper shape, the inclined surface may reduce the likelihood that the conductive adhesive layer 240 is cut or damaged at a connection portion of the end of the third opposite electrode 233 and the bank 181.

The connection electrode layer 250 electrically connects the first to third opposite electrodes 231, 232, and 233 to each other. The connection electrode layer 250 is integrally formed on the entire surface of the substrate 100 to cover the first to third pixel regions P1, P2, and P3. The connection electrode layer 250 has light transmittance. According to an exemplary embodiment, the connection electrode layer 250 may be a (semi) transmissive metallic layer including Ag and Mg. For example, the connection electrode layer 250 may include an Ag—Mg alloy in which Ag content is greater than Mg content.

A protective layer 260 may cover the connection electrode layer 250. The protective layer 260 may include, for example, an organic material.

The conductive adhesive layer 240 is located below the connection electrode layer 250. The conductive adhesive layer 240 may be integrally formed on the entire surface of the substrate 100 to cover the first to third pixel regions P1, P2, and P3. A thickness t1 of the conductive adhesive layer 240 may be less than a thickness t2 of the connection electrode layer 250.

The conductive adhesive layer 240 has light transmittance. The conductive adhesive layer 240 may include a metallic element that is different from that of the connection electrode layer 250. For example, the conductive adhesive layer 240 may include Al, In, and/or W. According to an exemplary embodiment, the conductive adhesive layer 240 may be a (semi) transmissive metallic layer including Al. According to another exemplary embodiment, the conductive adhesive layer 240 may be an oxide-metallic layer including In or W. For example, the conductive adhesive layer 240 may include the ITO, the IZO, InOx, and/or WOx.

A portion of the conductive adhesive layer 240 is respectively between the connection electrode layer 250 and the first to third opposite electrodes 231, 232, 233, and the rest of the conductive adhesive layer 240 is between the pixel-defining layer 180 and the connection electrode layer 250.

An upper surface 181s of the bank 181 may include an organic material that is different from that of a remainder of the bank 181. Referring to the enlarged portion of FIG. 1, an organic material, which is different from an organic material included in a first point 181a of the bank 181 (e.g., a central point of the bank 181 with respect to a thickness direction of the bank 181), may be included in the upper surface 181s of the bank 181. According to an exemplary embodiment, the first point 181a of the bank 181 may include a carbon-based organic material, while the upper surface 181s of the bank 181 may include both the carbon-based organic material and a fluorine-based organic material. The fluorine-based organic material may be a material used during a process of forming the first to third intermediate layers 221, 222, 223, and the first to third opposite electrodes 231, 232, 233, as described below.

Figure 2:
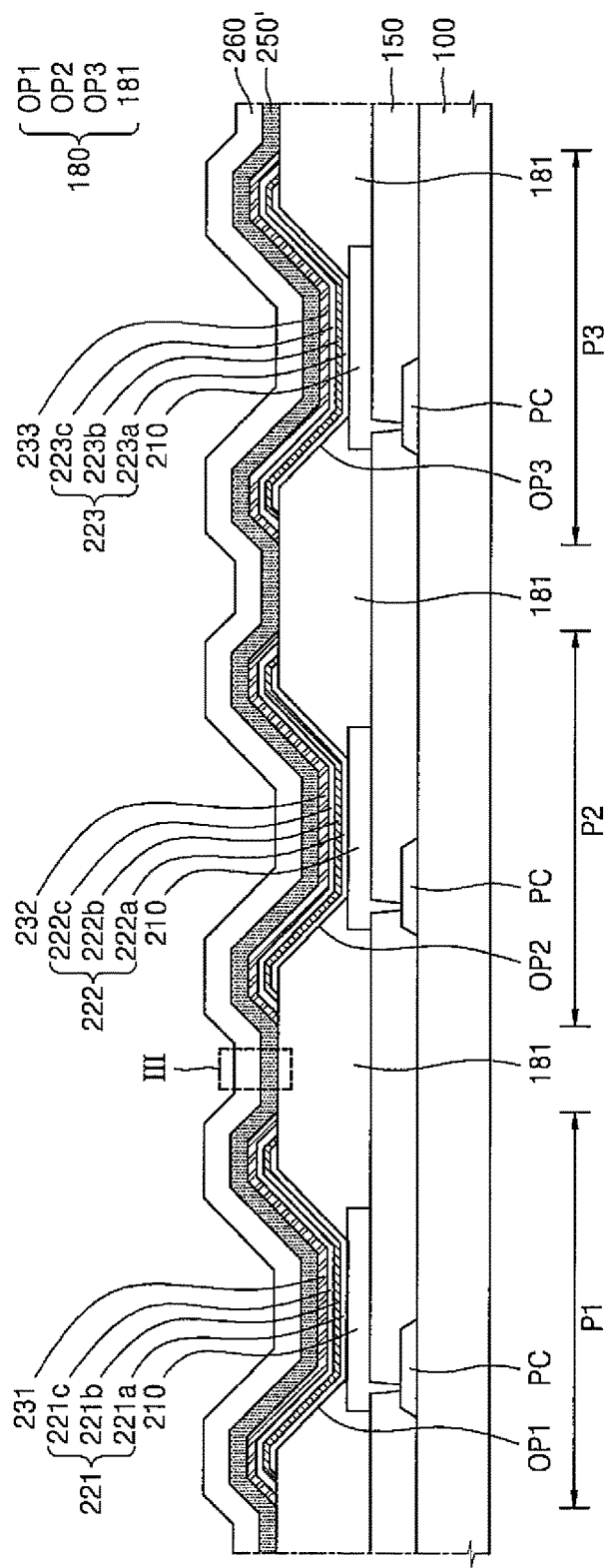
FIG. 2 is a cross-sectional view illustrating an organic light-emitting display device according to a comparison example.
Figure 3:
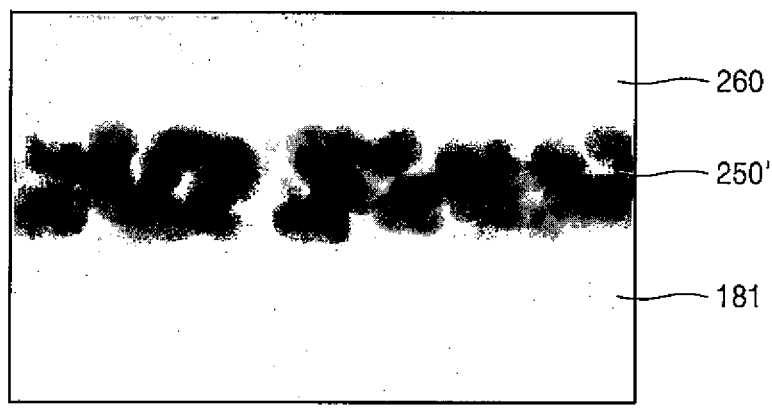
FIG. 3 is a transmission electron microscope (TEM) image that magnifies the region III of FIG. 2.

FIG. 2 is a cross-sectional view illustrating an organic light-emitting display device according to a comparison example, and FIG. 3 is a transmission electron microscope (TEM) image that corresponds to the region III of FIG. 2.

As a comparison example, when a connection electrode layer 250' is formed to directly contact the first to third opposite electrodes 231, 232, 233 as illustrated in FIG. 2, surface energy of the upper surface 181s of the bank 181 including a fluorine-based organic material increases, so that the connection electrode layer 250' formed on the upper surface 181s of the bank 181 may be cut by the surface energy, as illustrated in FIG. 3. Therefore, a surface resistance of the connection electrode layer 250' increases. To prevent cutting of the connection electrode layer 250', the connection electrode layer 250' may be formed to be thick. However, in this case, a light absorption rate of the connection electrode layer 250' increases, and thus light transmittance reduces.

However, according to an exemplary embodiment, because the conductive adhesive layer 240 having excellent adhesiveness is between the pixel-defining layer 180 and the connection electrode layer 250, cutting of the connection electrode layer 250 may be avoided or prevented. Therefore, the problem of a surface resistance increase, or the problem of light transmittance, etc. may be resolved.

FIGS. 4 to 14 are process cross-sectional views illustrating a method of manufacturing an organic light-emitting display device according to an exemplary embodiment.

Figure 4:
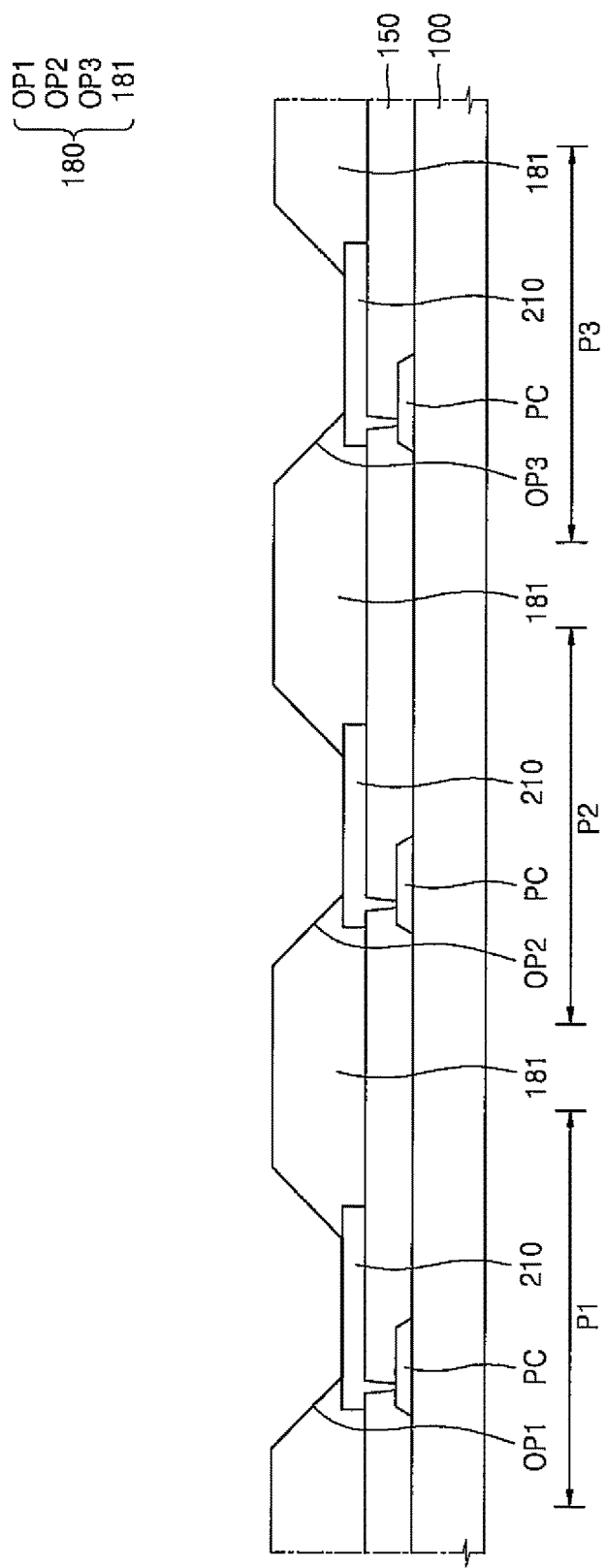
FIGS. 4 to 14 are process cross-sectional views illustrating a method of manufacturing an organic light-emitting display device according to an exemplary embodiment.

Referring to FIG. 4, the substrate 100 including the first to third pixel regions P1, P2, and P3 is prepared. A buffer layer for preventing penetration of impurities may be formed on the substrate 100, and a pixel circuit PC including a thin film transistor and a capacitor may be formed on the buffer layer. The first to third pixel regions P1, P2, and P3 each include one pixel circuit PC. The insulating layer 150 having an approximately flat upper surface covers the pixel circuit PC.

After that, a metallic layer is formed on the insulating layer 150, and the pixel electrodes 210 corresponding to the first to third pixel regions P1, P2, and P3 are formed by patterning the metallic layer. The pixel electrode 210 is a reflective electrode. According to an exemplary embodiment, the pixel electrode 210 may be a single reflective metallic layer including Ag, Al, Au, Pt, Cr, or an alloy thereof. According to another exemplary embodiment, the pixel electrode 210 may be a double or triple layer further including the ITO or IZO layer above and/or below the above-described single reflective metallic layer.

Next, an organic insulating layer may be formed on the substrate 100 including the pixel electrodes 210, and the pixel-defining layer 180 may be formed by patterning the organic insulating layer. The pixel-defining layer 180 includes the first to third openings OP1, OP2, and OP3 that expose the pixel electrodes 210, and also includes the bank 181 between adjacent ones of the openings OP1, OP2, and OP3. The pixel-defining layer 180 may include, for example, a carbon-based organic material.

Figure 5:
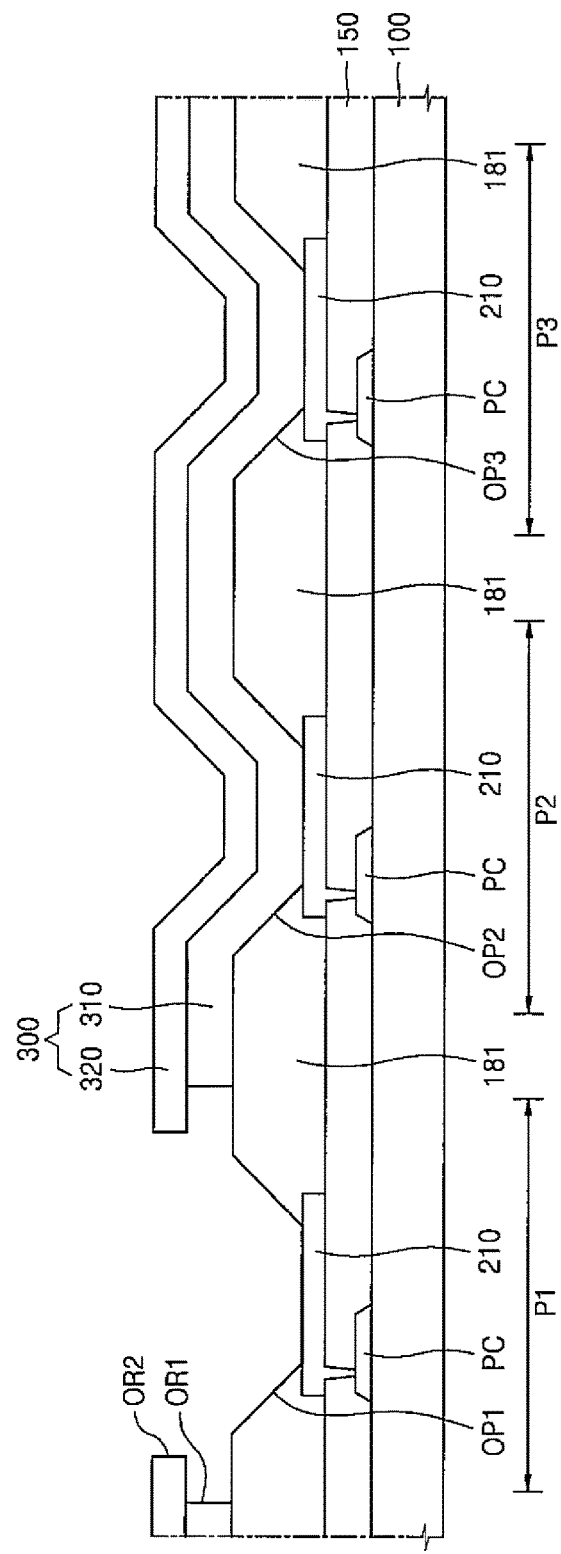

Referring to FIG. 5, a first masking pattern 300 covering the second and third pixel regions P2 and P3, while leaving the first pixel region P1 uncovered, is formed. The first masking pattern 300 may include a first mediation layer 310, which includes a first opening region OR1, and a first photosensitive pattern layer 320, which includes a second opening region OR2.

The first masking pattern 300 may be formed by sequentially forming a first organic material layer, which includes a non-photosensitive fluorine-based organic material, and forming a first photosensitive layer, and thereafter performing exposure, developing, and etching.

First, the first organic material layer and the first photosensitive layer are sequentially formed on the substrate 100, and a portion of the first photosensitive layer that corresponds to the first pixel region P1 is exposed. After that, the first photosensitive pattern layer 320 having the second opening region OR2 is formed by developing the first photosensitive layer. Next, the first mediation layer 310 having the first opening region OR1 is formed by etching a portion of the first organic material layer that is exposed via the second opening region OR2. The size of the first opening region OR1 may be formed to be greater than the size of the second opening region OR2 via an etching process.

The first and second opening regions OR1 and OR2 correspond to the first opening OP1 of the pixel-defining layer 180. The first opening OP1 (e.g., the bank 181 and the pixel electrode 210 exposed by the first opening OP1) is exposed via the first and second opening regions OR1 and OR2.

Figure 6:
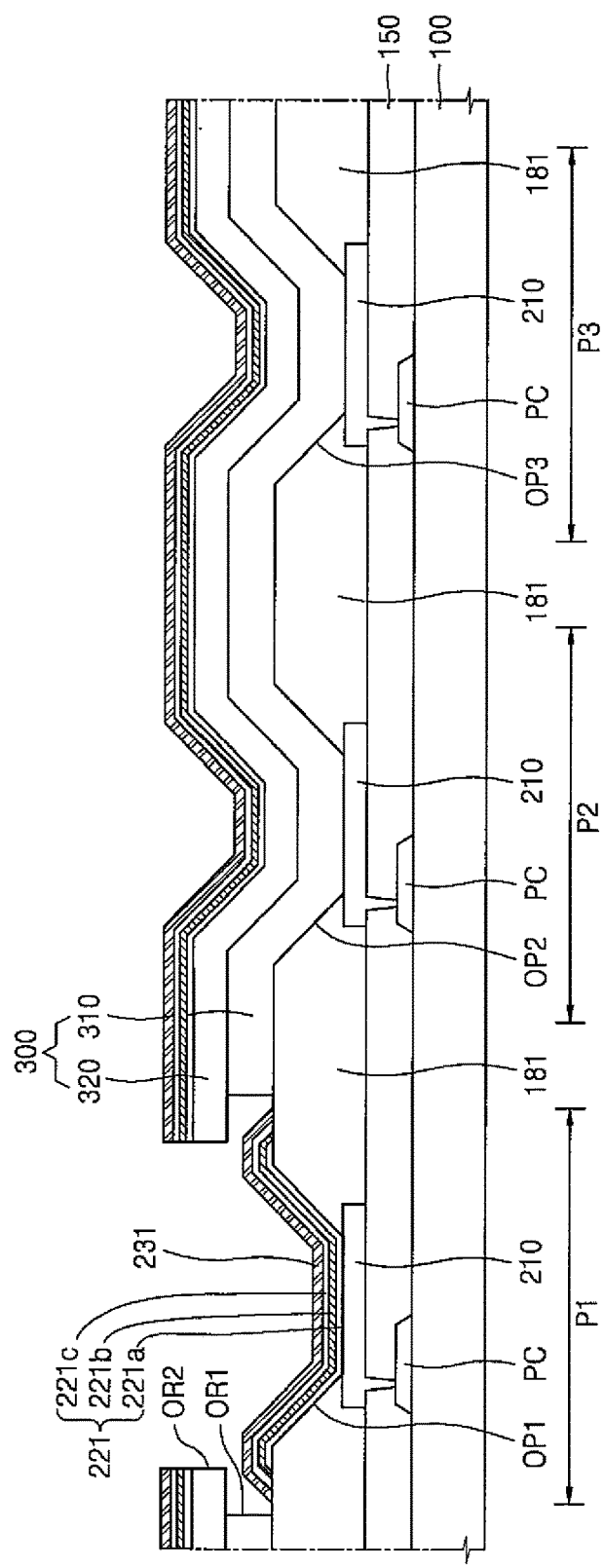

Referring to FIG. 6, the first intermediate layer 221 and the first opposite electrode 231 are sequentially formed on the substrate 100, which has the first masking pattern 300 thereon. The first intermediate layer 221 and the first opposite electrode 231 may be formed on the entire surface of the substrate 100. The first intermediate layer 221 may include the first emission layer 221b, and may include the first and second functional layers 221a and 221c respectively below and above the first emission layer 221b.

According to an exemplary embodiment, the first functional layer 221a, the first emission layer 221b, the second functional layer 221c, and the first opposite electrode 231 may be sequentially formed on the entire surface of the substrate 100 while the first masking pattern 300 is thereon.

The first emission layer 221b may include, for example, a fluorescent material or a phosphor material that may emit light of the red color. The first functional layer 221a may include the HTL and/or the HIL. The second functional layer 221c may include the EIL and/or the ETL. The HTL, the HIL, the EIL, and the ETL may be selectively formed depending on a material of the first emission layer 221b, and depending on a material of the first opposite electrode 231.

The first opposite electrode 231 has light transmittance. According to an exemplary embodiment, the first opposite electrode 231 may be a (semi) transmissive metallic layer including Ag and Mg. For example, the first opposite electrode 231 may include an Ag—Mg alloy in which Ag content is greater than Mg content. According to another exemplary embodiment, the first opposite electrode 231 may be a transparent conductive layer including TCO such as ITO and IZO.

During a deposition process of the first intermediate layer 221 and the first opposite electrode 231, deposition materials may move toward the substrate 100 along an oblique direction of the substrate 100, as well as along a direction perpendicular to the substrate 100. Therefore, the end of the first intermediate layer 221 and the end of the first opposite electrode 231 may extend to a space below the first photosensitive pattern layer 320 to be partially overlapped by the first photosensitive pattern layer 320. However, the end of the first intermediate layer 221 and the end of the first opposite electrode 231 do not contact the first mediation layer 310. If the end of the first intermediate layer 221 and the end of the first opposite electrode 231 contact the first mediation layer 310, a floating phenomenon may occur in which the end of the first intermediate layer 221 and the end of the first opposite electrode 231 are separated from the bank 181 during a lift-off process, in which the first masking pattern 300 is removed, as described below.

By the above-described deposition process, the end of the first opposite electrode 231 may have an inclined surface. The inclined surface has a forward taper shape that is smoothly connected with the upper surface of the bank 181, not a reverse taper shape.

While the first intermediate layer 221 and the first opposite electrode 231 are sequentially deposited, the first opposite electrode 231 may cover the end of the first intermediate layer 221. According to an exemplary embodiment, the first opposite electrode 231 may cover the end of the second functional layer 221c, the second functional layer 221c may cover the end of the first emission layer 221b, and the first emission layer 221b may cover the end of the first functional layer 221a.

Figure 7:
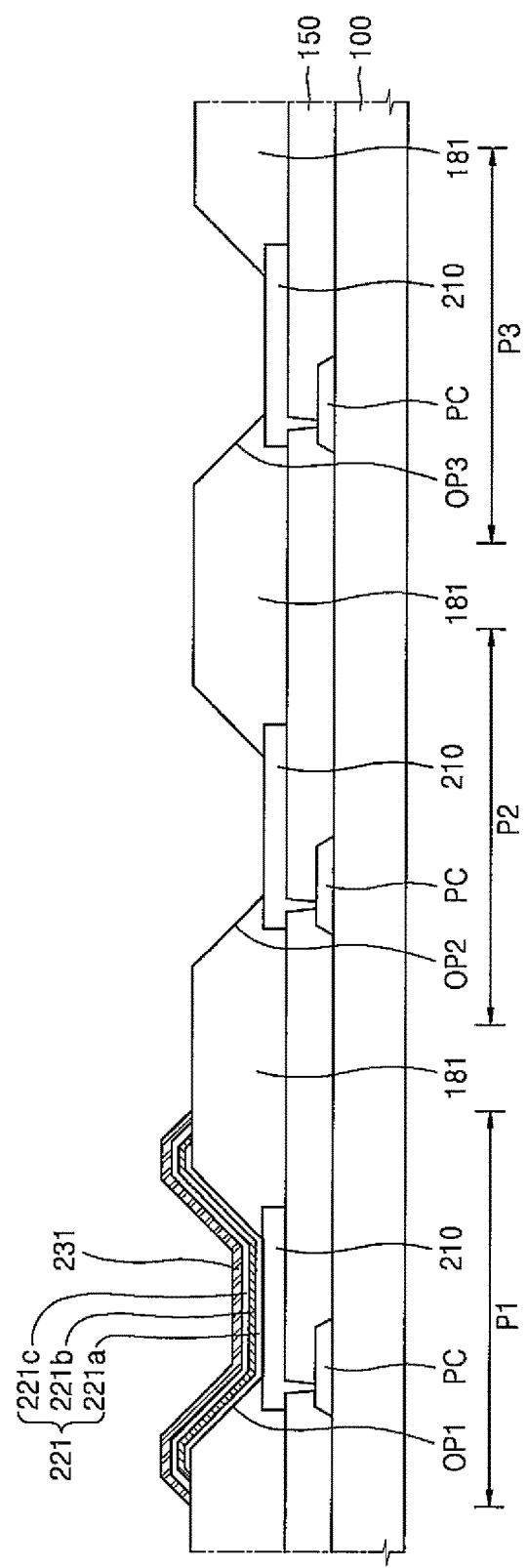

Referring to FIG. 7, the first masking pattern 300 is removed via the lift-off process. According to an exemplary embodiment, because the first mediation layer 310 formed while the first organic material layer is patterned includes a fluorine-based organic material, the first mediation layer 310 may be removed by using a fluorine-based solvent. The first photosensitive pattern layer 320 on the first mediation layer 310, and the first intermediate layer 221 and the first opposite electrode 231 stacked on the first photosensitive pattern layer 320, may be separated from the substrate 100 while the first mediation layer 310 is removed.

While the first masking pattern 300 is removed, the first intermediate layer 221 and the first opposite electrode 231 having an island shape remain in the first pixel region P1.

Figure 8:
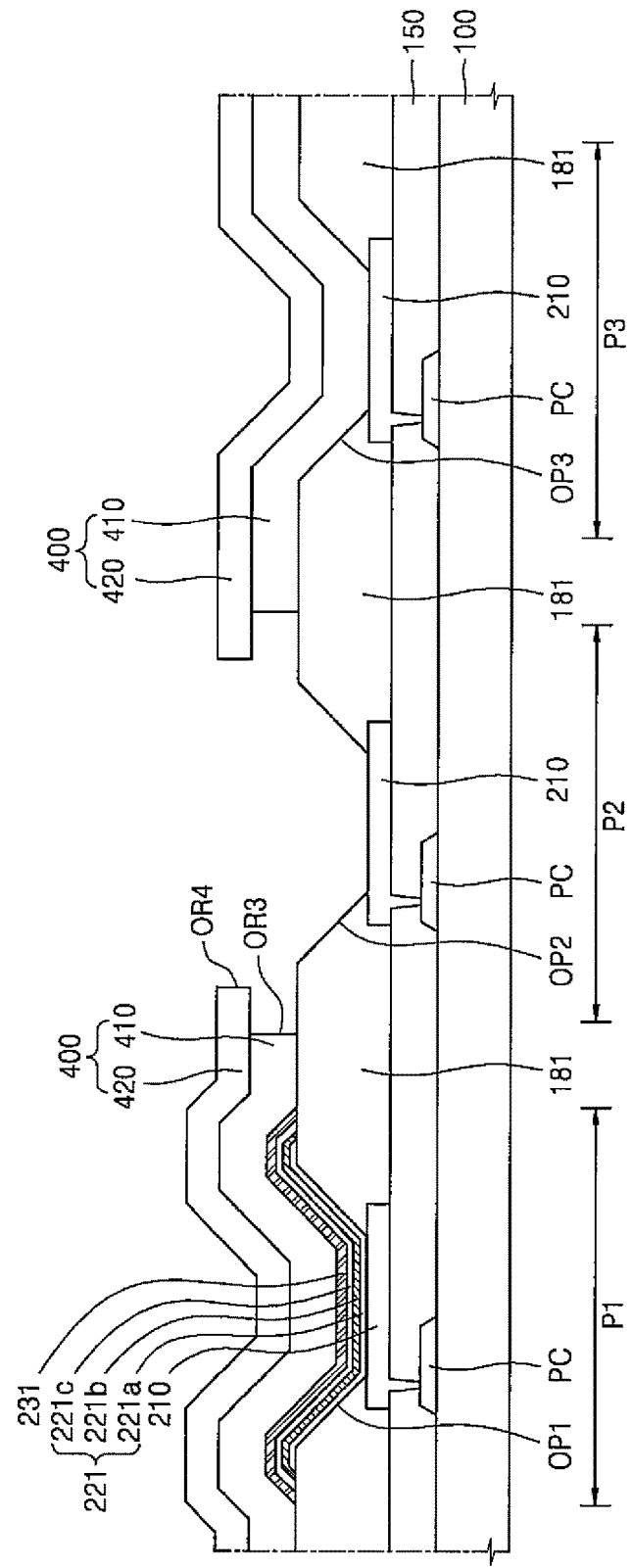

Referring to FIG. 8, a second masking pattern 400, which covers the first and third pixel regions P1 and P3 while leaving the second pixel region P2 uncovered, is formed. The second masking pattern 400 may include a second mediation layer 410 having a third opening region OR3 corresponding to the second pixel region P2, and may also include a second photosensitive pattern layer 420 having a fourth opening region OR4.

The second masking pattern 400 may be formed by sequentially forming a second organic material layer including a non-photosensitive fluorine-based organic material, forming a second photosensitive layer, and by then performing exposure, developing, and etching.

First, the second organic material layer and the second photosensitive layer are sequentially formed on the substrate 100, and a portion of the second photosensitive layer that corresponds to the second pixel region P2 is exposed. After that, the second photosensitive pattern layer 420 having the fourth opening region OR4 is formed by developing the second photosensitive layer. Next, the second mediation layer 410 having the third opening region OR3 is formed by etching a portion of the second organic material layer that is exposed via the fourth opening region OR4. The size of the third opening region OR3 may be formed to be greater than the size of the fourth opening region OR4 via an etching process.

The third and fourth opening regions OR3 and OR4 correspond to the second opening OP2 of the pixel-defining layer 180. The second opening OP2 (e.g., the bank 181 and the pixel electrode 210 exposed by the second opening OP2) is exposed via the third and fourth opening regions OR3 and OR4.

Figure 9:
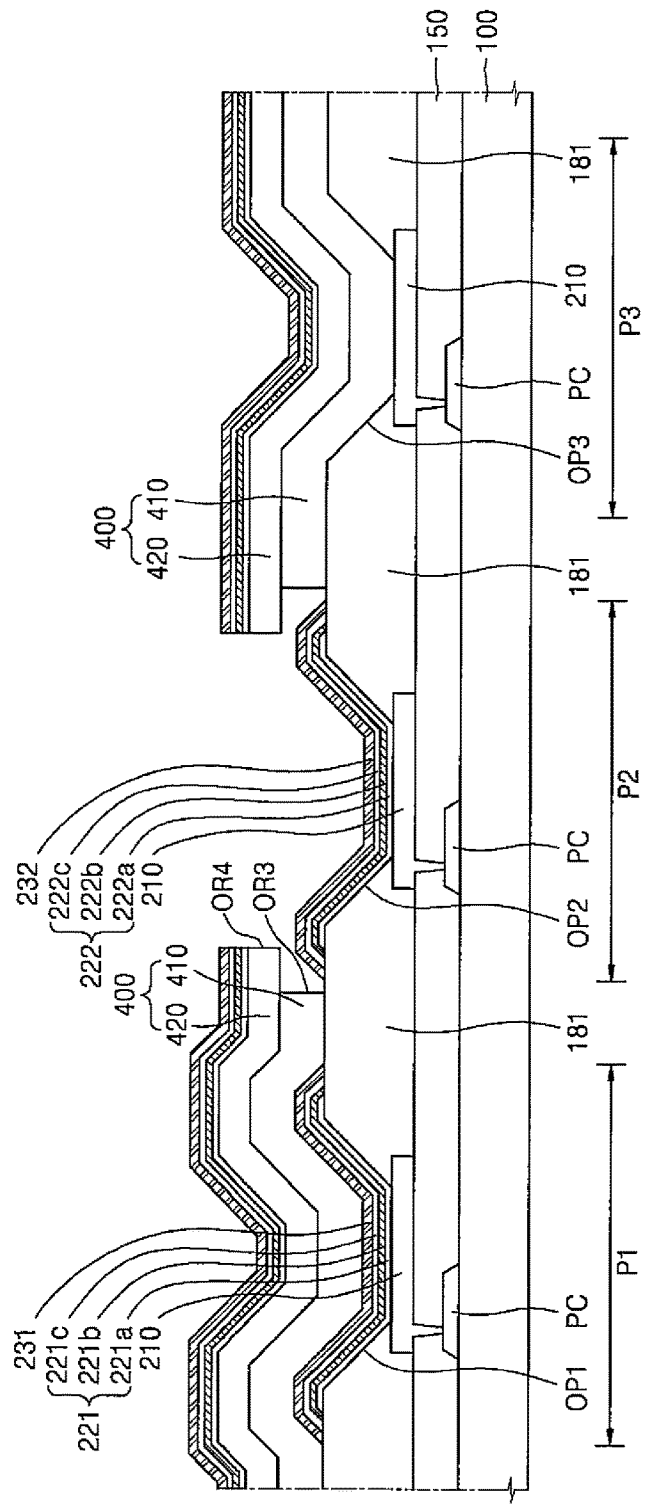

Referring to FIG. 9, the second intermediate layer 222 and the second opposite electrode 232 are sequentially formed on the substrate 100, which is partially covered by the second masking pattern 400. The second intermediate layer 222 and the second opposite electrode 232 may be formed on the entire surface of the substrate 100 and on the second masking pattern 400. The second intermediate layer 222 may include the second emission layer 222b, and may include the first and second functional layers 222a and 222c respectively located below and above the second emission layer 222b.

According to an exemplary embodiment, the first functional layer 222a, the second emission layer 222b, the second functional layer 222c, and the second opposite electrode 232 may be sequentially formed on the entire surface of the substrate 100 including the second masking pattern 400.

The second emission layer 222b may include, for example, a fluorescent material or a phosphor material that may emit light of the green color. The first functional layer 222a may include the HTL and/or the HIL. The second functional layer 222c may include the EIL and/or the ETL. The HTL, the HIL, the EIL, and the ETL may be selectively formed depending on a material of the second emission layer 222b and depending on a material of the second opposite electrode 232.

The second opposite electrode 232 has light transmittance. According to an exemplary embodiment, the second opposite electrode 232 may be a (semi) transmissive metallic layer including Ag and Mg. For example, the second opposite electrode 232 may include an Ag—Mg alloy in which Ag content is greater than Mg content. According to another exemplary embodiment, the second opposite electrode 232 may be a transparent conductive layer including TCO, such as ITO and IZO.

During a deposition process of the second intermediate layer 222 and the second opposite electrode 232, deposition materials may move toward the substrate 100 along an oblique direction of the substrate 100, as well as in a direction perpendicular to the substrate 100. Therefore, the end of the second intermediate layer 222 and the end of the second opposite electrode 232 may extend to a space below the second photosensitive pattern layer 420 to be partially overlapped by the second photosensitive pattern layer 420. However, the end of the second intermediate layer 222 and the end of the second opposite electrode 232 do not contact the second mediation layer 410. If the end of the second intermediate layer 222 and the end of the second opposite electrode 232 contact the second mediation layer 410, a floating phenomenon may occur, whereby the end of the second intermediate layer 222 and the end of the second opposite electrode 232 may be separated from the bank 181 during the lift-off process of the second masking patter 400, as described below.

By the above-described deposition process, the end of the second opposite electrode 232 may have an inclined surface. The inclined surface has a forward taper shape that is smoothly connected with the upper surface of the bank 181, not a reverse taper shape.

While the second intermediate layer 222 and the second opposite electrode 232 are sequentially deposited, the second opposite electrode 232 may cover the end of the second intermediate layer 222. According to an exemplary embodiment, the second opposite electrode 232 may cover the end of the second functional layer 222c, the second functional layer 222c may cover the end of the second emission layer 222b, and the second emission layer 222b may cover the end of the first functional layer 222a.

Figure 10:
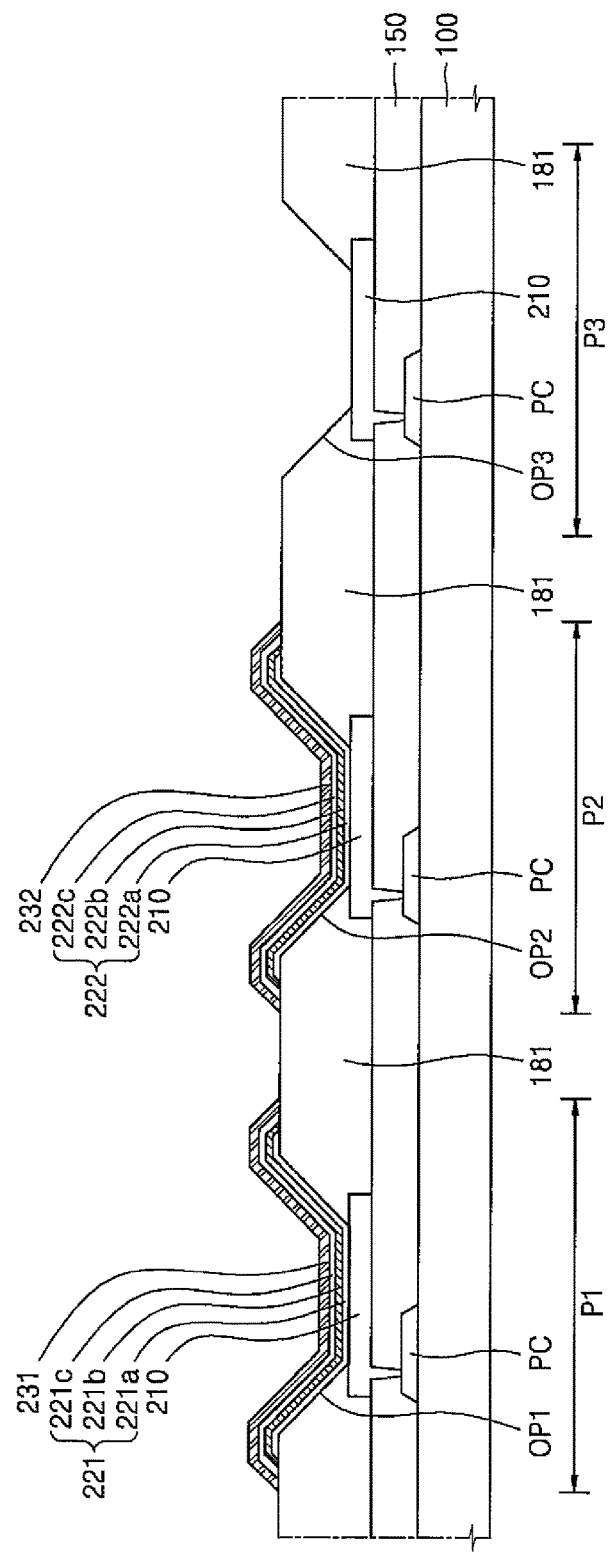

Referring to FIG. 10, the second masking pattern 400 is removed via the lift-off process. According to an exemplary embodiment, because the second mediation layer 410 formed while the second organic material layer is patterned includes a fluorine-based organic material, the second mediation layer 410 may be removed by using a fluorine-based solvent. The second photosensitive pattern layer 420 on the second mediation layer 410, and the second intermediate layer 222 and the second opposite electrode 232 stacked on the second photosensitive pattern layer 420, may be separated from the substrate 100 while the second mediation layer 410 is removed.

While the second masking pattern 400 is removed, the second intermediate layer 222 and the second opposite electrode 232 having an island shape remain in the second pixel region P2.

Figure 11:
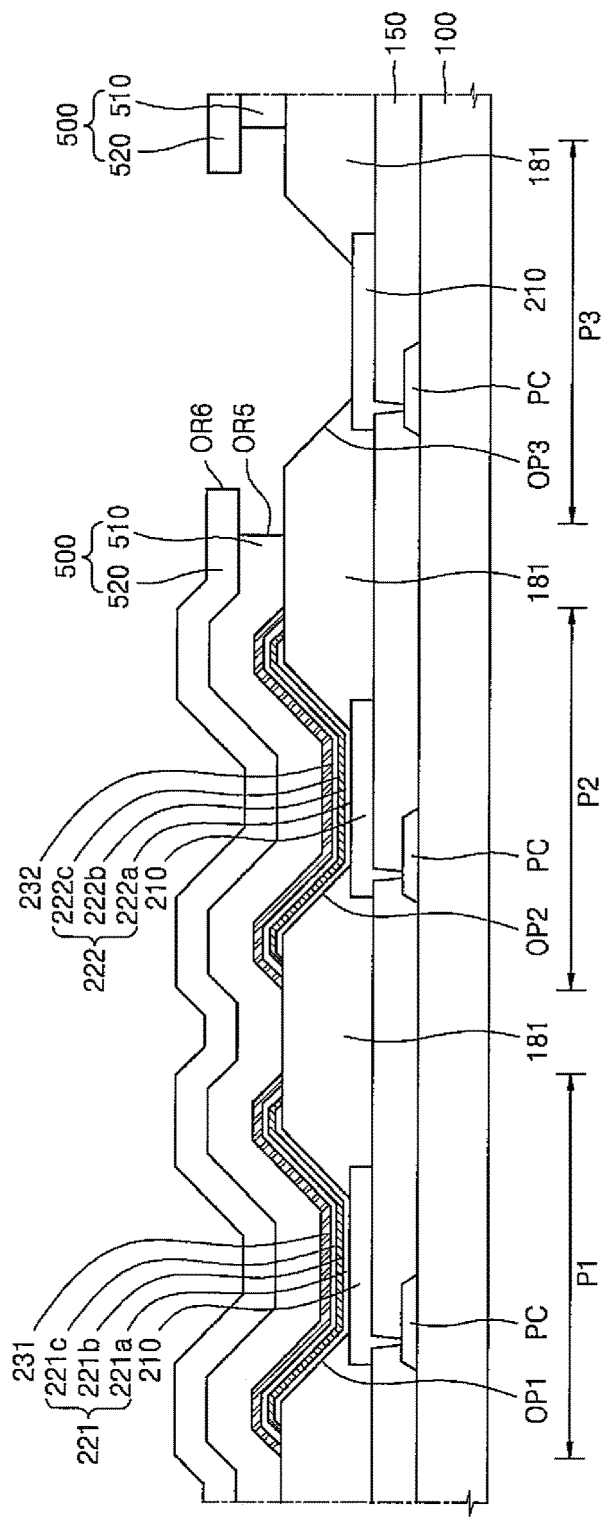

Referring to FIG. 11, a third masking pattern 500 leaving the third pixel region P3 uncovered, while covering the first and second pixel regions P1 and P2, is formed. The third masking pattern 500 may include a third mediation layer 510 having a fifth opening region OR5, and may include a third photosensitive pattern layer 520 having a sixth opening region OR6.

The third masking pattern 500 may be formed by sequentially forming a third organic material layer including a non-photosensitive fluorine-based organic material, and forming a third photosensitive layer, and by then performing exposure, developing, and etching.

First, the third organic material layer and the third photosensitive layer are sequentially formed on the substrate 100, and a portion of the third photosensitive layer that corresponds to the third pixel region P3 is exposed. After that, the third photosensitive pattern layer 520 having the sixth opening region OR6 is formed by developing the third photosensitive layer. Next, the third mediation layer 510 having the fifth opening region OR5 is formed by etching a portion of the third organic material layer that is exposed via the sixth opening region OR6. The size of the fifth opening region OR5 may be formed to be greater than the size of the sixth opening region OR6 via an etching process.

The fifth and sixth opening regions OR5 and OR6 correspond to the third opening OP3 of the pixel-defining layer 180. The third opening OP3 (e.g., the bank 181 and the pixel electrode 210 exposed by the third opening OP3) is exposed via the fifth and sixth opening regions OR5 and OR6.

Figure 12:
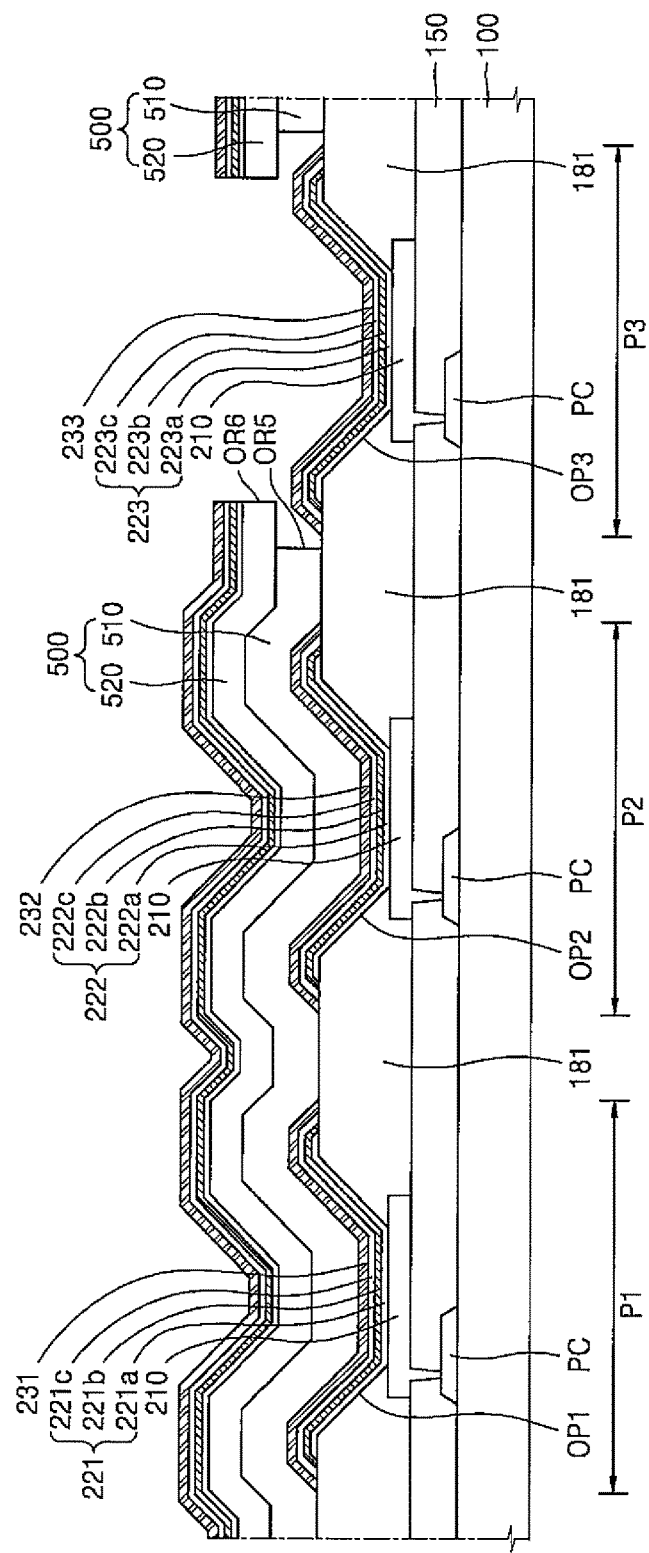

Referring to FIG. 12, the third intermediate layer 223 and the third opposite electrode 233 are sequentially formed on the substrate 100 including the third masking pattern 500. The third intermediate layer 223 and the third opposite electrode 233 may be formed on the entire surface of the substrate 100 and on the third masking pattern 500. The third intermediate layer 223 may include the third emission layer 223b, and may include the first and second functional layers 223a and 223c respectively located below and above the third emission layer 223b.

According to an exemplary embodiment, the first functional layer 223a, the third emission layer 223b, the second functional layer 223c, and the third opposite electrode 233 may be sequentially formed on the entire surface of the substrate 100 including the third masking pattern 500.

The third emission layer 223b may include, for example, a fluorescent material or a phosphor material that may emit light of the blue color. The first functional layer 223a may include the HTL and/or the HIL. The second functional layer 223c may include the EIL and/or the ETL. The HTL, the HIL, the EIL, and the ETL may be selectively formed depending on a material of the third emission layer 223b, and depending on a material of the third opposite electrode 233.

The third opposite electrode 233 has light transmittance. According to an exemplary embodiment, the third opposite electrode 233 may be a (semi) transmissive metallic layer including Ag and Mg. For example, the third opposite electrode 233 may include an Ag—Mg alloy in which Ag content is greater than Mg content. According to another exemplary embodiment, the third opposite electrode 233 may be a transparent conductive layer including TCO such as ITO and IZO.

During a deposition process of the third intermediate layer 223 and the third opposite electrode 233, deposition materials may move toward the substrate 100 along an oblique direction of the substrate 100, and may also move along a direction perpendicular to the substrate 100. Therefore, the end of the third intermediate layer 223 and the end of the third opposite electrode 233 may extend to a space below the third photosensitive pattern layer 520 to be partially overlapped by the third photosensitive pattern layer 520. However, the end of the third intermediate layer 223 and the end of the third opposite electrode 233 do not contact the third mediation layer 510. If the end of the third intermediate layer 223 and the end of the third opposite electrode 233 contact the third mediation layer 510, a floating phenomenon may occur in which the end of the third intermediate layer 223 and the end of the third opposite electrode 233 are separated from the bank 181 during the lift-off process of the third masking pattern 500, as described below.

By the above-described deposition process, the end of the third opposite electrode 233 may have an inclined surface. The inclined surface has a forward taper shape that is smoothly connected with the upper surface of the bank 181, not a reverse taper shape.

While the third intermediate layer 223 and the third opposite electrode 233 are sequentially deposited, the third opposite electrode 233 may cover the end of the third intermediate layer 223. According to an exemplary embodiment, the third opposite electrode 233 may cover the end of the second functional layer 223c, the second functional layer 223c may cover the end of the third emission layer 223b, and the third emission layer 223b may cover the end of the first functional layer 223a.

Figure 13:
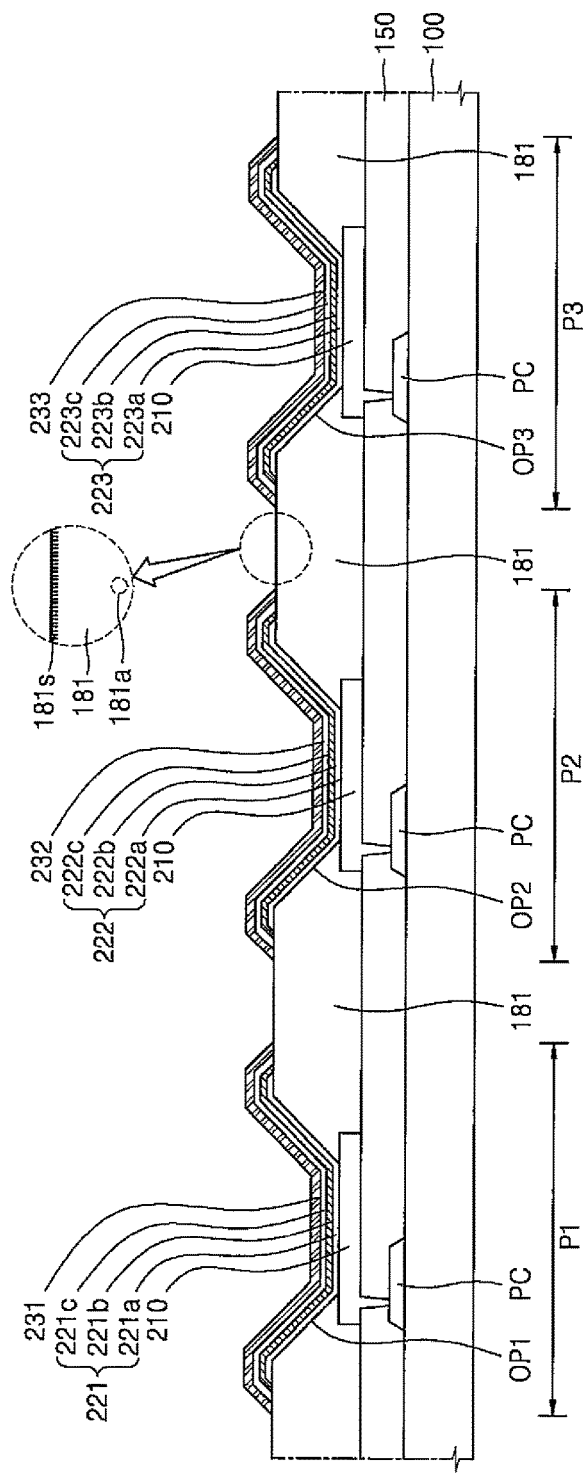

Referring to FIG. 13, the third masking pattern 500 is removed via the lift-off process. According to an exemplary embodiment, because the third mediation layer 510 formed while the third organic material layer is patterned includes a fluorine-based organic material, the third mediation layer 510 may be removed by using a fluorine-based solvent. The third photosensitive pattern layer 520 on the third mediation layer 510, as well as the third intermediate layer 223 and the third opposite electrode 233 stacked on the third photosensitive pattern layer 520, may be separated from the substrate 100 while the third mediation layer 510 is removed.

While the third masking pattern 500 is removed, the third intermediate layer 223 and the third opposite electrode 233 having an island shape remain in the third pixel region P3.

By the deposition and lift-off processes that use the first to third masking patterns 300, 400, and 500, a portion of a fluorine-based organic material forming the first to third mediation layers 310, 410, and 510 forms the upper surface of the bank 181. Referring to the enlarged area shown in FIG. 13, the first point 181a of the bank 181 (e.g., a central point of the bank 181 with respect to a thickness direction of the bank 181) may include a carbon-based organic material, but the upper portion of the bank 181 (e.g., an upper surface 181s of the bank 181) may include not only the carbon-based material, but may also include a fluorine-based organic material.

Figure 14:
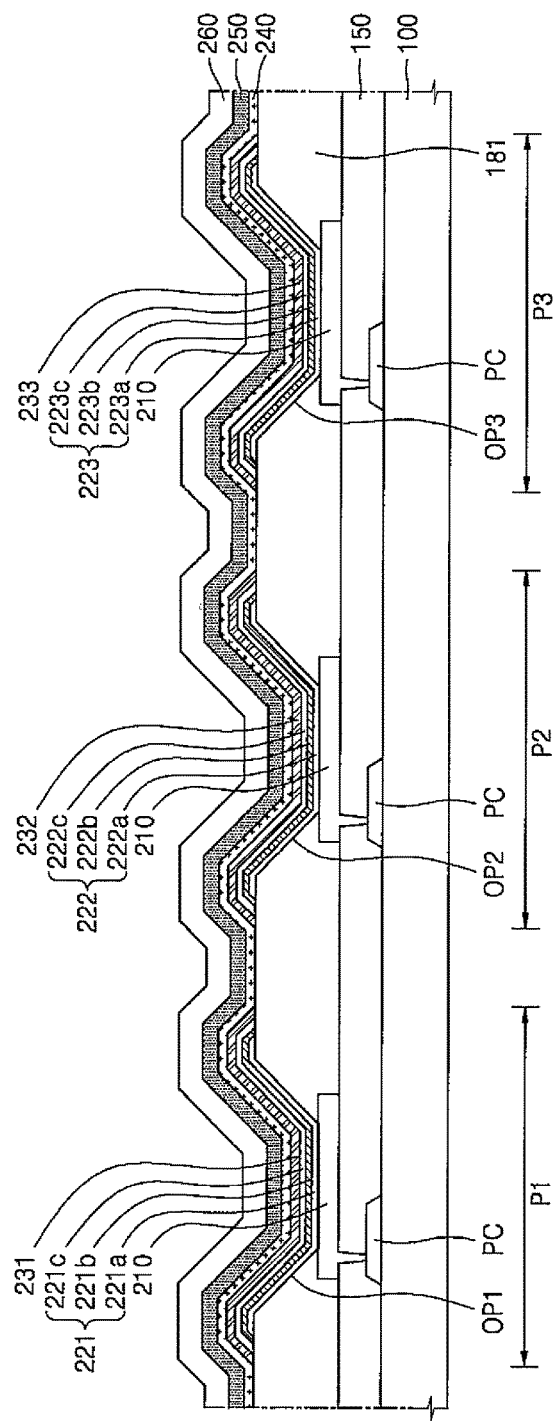

Referring to FIG. 14, the conductive adhesive layer 240 and the connection electrode layer 250 are formed on the substrate 100. After that, the protective layer 260 including an organic material may be further formed on the connection electrode layer 250.

The connection electrode layer 250 electrically connects the first to third opposite electrodes 231, 232, and 233, which are spaced apart from each other. The connection electrode layer 250 is integrally formed on the entire surface of the substrate 100 to cover the first to third pixel regions P1, P2, and P3. The connection electrode layer 250 may be a (semi) transmissive metallic layer including Ag and Mg. For example, the connection electrode layer 250 may include an Ag—Mg alloy in which Ag content is greater than Mg content.

As described with reference to FIGS. 2 and 3, when the connection electrode layer 250' of the organic light-emitting display device according to a comparison example is formed to directly contact the first to third opposite electrodes 231, 232, and 233, the connection electrode layer 250' may be cut on the bank 181. Therefore, a surface resistance of the connection electrode layer 250' increases. To prevent cutting of the connection electrode layer 250', the connection electrode layer 250' may be formed to be thicker. However, in this case, a light absorption rate of the connection electrode layer 250' increases, and thus transmittance reduces.

However, according to an exemplary embodiment of the present invention, because the connection electrode layer 250 is formed after the conductive adhesive layer 240 having excellent adhesiveness is formed, the problems of the cutting of the connection electrode layer 250 and a surface resistance increase may be prevented.

The conductive adhesive layer 240 may include a metallic layer or an oxide metallic layer having excellent adhesiveness. According to an exemplary embodiment, the conductive adhesive layer 240 may be a (semi) transmissive metallic layer including Al. According to another exemplary embodiment, the conductive adhesive layer 240 may be a transparent conductive oxide metallic layer including In or W. For example, the conductive adhesive layer 240 may include ITO, IZO, InOx, or WOx.

A portion of the conductive adhesive layer 240 is disposed between the first to third opposite electrodes 231, 232, 233, and the connection electrode layer 250, and the rest of the conductive adhesive layer 240 is disposed between the bank 181 and the connection electrode layer 250. Since the conductive adhesive layer 240 has excellent adhesiveness, the conductive adhesive layer 240 is well attached to not only the upper surface of the first to third opposite electrodes 231, 232, 233, but is also attached to the upper surface 181s of the bank 181.

Table 1 represents resistance values according to a comparison example and exemplary embodiments.

TABLE 1

| (Conductive adhesive layer/connection electrode layer) | Comparison example (Yb/AgMg) | Exemplary embodiment 1 (Al/Yb—AgMg) | Exemplary embodiment 2 (Al/AgMg) |
|---|---|---|---|
| Surface resistance (ohm/sq) | ∞ | 23 | 24 |

In Table 1, the comparison example represents a case where a conductive adhesive layer includes a semi transmissive metallic layer including Yb and a connection electrode layer includes an alloy of Ag and Mg. The exemplary embodiment 1 represents a case where a conductive adhesive layer includes a semi transmissive metallic layer including Al, and where a connection electrode layer includes a first layer including Yb and a second layer including an alloy of Ag and Mg. The exemplary embodiment 2 represents a case where a conductive adhesive layer includes a semi transmissive metallic layer including Al, and where a connection electrode layer includes an alloy of Ag and Mg.

Referring to Table 1, it is revealed that when a conductive adhesive layer includes a semi transmissive metallic layer including Al, an excellent surface resistance is achieved.

Exemplary embodiments may manufacture an organic light-emitting display device via a relatively simple process, and stably perform electrical connection of opposite electrodes corresponding to respective pixel regions and spaced apart from each other.

Though the inventive concept has been described with reference to exemplary embodiments illustrated in the drawings, these are provided for an exemplary purpose only, and those of ordinary skill in the art will understand that various modifications and other equivalent embodiments may be made therein.

Therefore, the spirit and scope of the inventive concept should be defined by the following claims and their equivalents.

What is claimed is:

1. An organic light-emitting display device comprising:
   a substrate comprising a first pixel region and a second pixel region;
   pixel electrodes respectively corresponding to the first and second pixel regions;
   a pixel-defining layer on the substrate and defining a first opening corresponding to the first pixel region, and defining a second opening corresponding to the second pixel region;
   a first intermediate layer in the first opening and corresponding to the first pixel region;
   a first opposite electrode on the first intermediate layer;
   a second intermediate layer in the second opening and corresponding to the second pixel region;
   a second opposite electrode on the second intermediate layer and spaced from the first opposite electrode;
   a connection electrode layer disposed on the pixel-defining layer, the connection electrode layer is continuous between the first pixel region and the second pixel region to cover the first pixel region and the second pixel region, and to be electrically connected to the first opposite electrode and the second opposite electrode; and
   a conductive adhesive layer between the pixel-defining layer and the connection electrode layer, and contacting the pixel-defining layer.

2. The device of claim 1, wherein the connection electrode layer comprises a first metallic element, and
   wherein the conductive adhesive layer comprises a second metallic element that is different from the first metallic element.

3. The device of claim 2, wherein the first metallic element comprises at least one of silver (Ag) or magnesium (Mg).

4. The device of claim 2, wherein the second metallic element comprises aluminum (Al), indium (In), or tungsten (W).

5. The device of claim 1, wherein a thickness of the conductive adhesive layer is smaller than a thickness of the connection electrode layer.

6. The device of claim 1, wherein the conductive adhesive layer comprises a metallic layer having light transmittance.

7. The device of claim 1, wherein the conductive adhesive layer comprises an oxide metallic layer having light transmittance.

8. An organic light-emitting display device comprising:
a substrate comprising a first pixel region and a second pixel region;
pixel electrodes respectively corresponding to the first and second pixel regions;
a pixel-defining layer on the substrate and defining a first opening corresponding to the first pixel region, and defining a second opening corresponding to the second pixel region;
a first intermediate layer in the first opening and corresponding to the first pixel region;
a first opposite electrode on the first intermediate layer;
a second intermediate layer in the second opening and corresponding to the second pixel region;
a second opposite electrode on the second intermediate layer and spaced from the first opposite electrode;
a connection electrode layer on the pixel-defining layer to cover the first pixel region and to cover the second pixel region, and to be electrically connected to the first opposite electrode and the second opposite electrode; and
a conductive adhesive layer between the pixel-defining layer and the connection electrode layer, and contacting the pixel-defining layer,
wherein the pixel-defining layer comprises a bank between the first opening and the second opening,
wherein a first point of the bank comprises a first organic material, and
wherein an upper surface of the bank comprises a second organic material that is different from the first organic material.

9. The device of claim 8, wherein the conductive adhesive layer directly contacts the upper surface of the bank.

10. The device of claim 8, wherein the second organic material comprises a fluorine-based polymer.

11. The device of claim 10, wherein the first point of the bank is below the upper surface of the bank.

12. A method of manufacturing an organic light-emitting display device, the method comprising:
preparing a substrate comprising a first pixel region and a second pixel region;
forming pixel electrodes respectively corresponding to the first pixel region and the second pixel region;
forming a pixel-defining layer on the substrate, the pixel-defining layer defining a first opening and a second opening that respectively expose the pixel electrodes;
forming a first intermediate layer corresponding to the first pixel region;
forming a first opposite electrode on the first intermediate layer;
forming a second intermediate layer corresponding to the second pixel region;
forming a second opposite electrode on the second intermediate layer;
forming a conductive adhesive layer on the pixel-defining layer; and
forming a connection electrode layer that is continuous between the first pixel region and the second pixel region to be electrically connected to the first opposite electrode and the second opposite electrode.

13. The method of claim 12, wherein the connection electrode layer comprises a first metallic element, and
wherein the conductive adhesive layer comprises a second metallic element that is different from the first metallic element.

14. The method of claim 13, wherein the first metallic element comprises at least one of silver (Ag) and magnesium (Mg).

15. The method of claim 13, wherein the second metallic element comprises aluminum (Al), indium (In), or tungsten (W).

16. The method of claim 12, wherein the pixel-defining layer comprises a bank between the first opening and the second opening,
wherein, in the forming of the conductive adhesive layer, the conductive adhesive layer directly contacts an upper surface of the bank, the upper surface of the bank comprising a second organic material that is different from a first organic material at a first point of the bank.

17. The method of claim 16, wherein the second organic material comprises a fluorine-based polymer.

18. The method of claim 12, wherein the forming of the first intermediate layer and the forming of the first opposite electrode comprise using a first masking pattern, the first masking pattern comprising:
a first mediation layer for directly contacting an upper surface of the pixel-defining layer adjacent the first opening, and defining a first opening region corresponding to the first opening; and
a first photosensitive pattern layer on the first mediation layer, and comprising a second opening region corresponding to the first opening region.

19. The method of claim 18, wherein a size of the first opening region is greater than a size of the second opening region.

20. The method of claim 18, further comprising:
removing the first masking pattern by using a solvent to remove the first mediation layer.

* * * * *